US009383637B2

(12) United States Patent
Onoue et al.

(10) Patent No.: US 9,383,637 B2
(45) Date of Patent: Jul. 5, 2016

(54) SUBSTRATE WITH MULTILAYER REFLECTIVE FILM, REFLECTIVE MASK BLANK FOR EUV LITHOGRAPHY, METHOD OF MANUFACTURING REFLECTIVE MASK FOR EUV LITHOGRAPHY AND METHOD OF MANUFACTURING SEMICONDUCTOR DEVICE

(71) Applicant: HOYA CORPORATION, Shinjuku-ku, Tokyo (JP)

(72) Inventors: Takahiro Onoue, Shinjuku-ku (JP); Toshihiko Orihara, Shinjuku-ku (JP)

(73) Assignee: HOYA CORPORATION, Tokyo (JP)

( * ) Notice: Subject to any disclaimer, the term of this patent is extended or adjusted under 35 U.S.C. 154(b) by 170 days.

(21) Appl. No.: 14/373,715

(22) PCT Filed: Mar. 21, 2013

(86) PCT No.: PCT/JP2013/057957
§ 371 (c)(1),
(2) Date: Jul. 22, 2014

(87) PCT Pub. No.: WO2013/141268
PCT Pub. Date: Sep. 26, 2013

(65) Prior Publication Data
US 2014/0370424 A1  Dec. 18, 2014

(30) Foreign Application Priority Data

Mar. 23, 2012  (JP) .................................. 2012-067142

(51) Int. Cl.
*G03F 1/48* (2012.01)
*G03F 1/24* (2012.01)
*B82Y 10/00* (2011.01)
*B82Y 40/00* (2011.01)
*H01L 21/033* (2006.01)

(52) U.S. Cl.
CPC . *G03F 1/24* (2013.01); *B82Y 10/00* (2013.01); *B82Y 40/00* (2013.01); *G03F 1/48* (2013.01); *H01L 21/0332* (2013.01); *H01L 21/0337* (2013.01); *Y10T 428/31678* (2015.04)

(58) Field of Classification Search
CPC ..................................... G03F 1/48; G03F 1/24
USPC ................................................................ 430/5
See application file for complete search history.

(56) References Cited

U.S. PATENT DOCUMENTS

2002/0045108 A1   4/2002  Lee et al.
2004/0253426 A1*  12/2004 Yakshin ................. B82Y 10/00
                                                           428/212
2009/0042110 A1   2/2009  Matsuo et al.

FOREIGN PATENT DOCUMENTS

| JP | 2002-122981 A | 4/2002 |
| JP | 2002-353123 A | 12/2002 |
| JP | 2004-171034 A | 6/2004 |
| JP | 2007-294840 A | 11/2007 |
| JP | 2008-016821 A | 1/2008 |
| JP | 2011-192693 A | 9/2011 |

OTHER PUBLICATIONS

International Search Report for PCT/JP2013/057957 dated Jun. 18, 2013.

* cited by examiner

Primary Examiner — Stephen Rosasco
(74) Attorney, Agent, or Firm — Sughrue Mion, PLLC

(57) ABSTRACT

An object of the present invention is to provide a substrate with a multilayer reflective film and the like used in the manufacturing of a reflective mask blank for EUV lithography which is to be subjected to dry etching with a Cl-based gas, wherein in the substrate with the multilayer reflective film, the loss of protective films by the dry etching and subsequent wet cleaning is very limited. The present invention is a substrate with a multilayer reflective film used in the manufacturing of a reflective mask blank for EUV lithography, comprising a substrate, a multilayer reflective film disposed on the substrate to reflect EUV light, and a protective film disposed on the multilayer reflective film to protect the multilayer reflective film, the protective film includes an alloy containing at least two metals, the alloy being an all-proportional solid solution.

22 Claims, 2 Drawing Sheets (a)

(b)

(c)

SUBSTRATE WITH MULTILAYER REFLECTIVE FILM, REFLECTIVE MASK BLANK FOR EUV LITHOGRAPHY, METHOD OF MANUFACTURING REFLECTIVE MASK FOR EUV LITHOGRAPHY AND METHOD OF MANUFACTURING SEMICONDUCTOR DEVICE

CROSS REFERENCE TO RELATED APPLICATIONS

This application is a National Stage of International Application No. PCT/JP2013/057957 filed Mar. 21, 2013, claiming priority based on Japanese Patent Application No. 2012-067142, filed Mar. 23, 2012, the contents of all of which are incorporated herein by reference in their entirety.

TECHNICAL FIELD

The present invention relates to a substrate with a multilayer reflective film which has a very limited loss of a protective film by dry etching with a chlorine-based gas and subsequent wet cleaning, a reflective mask blank for EUV lithography obtained from the substrate, a method of manufacturing a reflective mask for EUV lithography utilizing the mask blank, and method of manufacturing a semiconductor device utilizing a reflective mask for EUV lithography obtained by the manufacturing method.

BACKGROUND ART

In the semiconductor industry, the recent finer designs of semiconductor devices have led to a need for finer patterning than the transfer limit according to a photolithographic process. Extreme ultra violet (hereinafter, EUV) lithography is a promising exposure technique which uses EUV light having shorter wavelengths, in order to realize transferring of such fine patterns. Here, the term "EUV light" indicates light having wavelengths in the soft X-ray region or the vacuum UV region, specifically, wavelengths of about 0.2 to 100 nm.

Reflective masks used in this EUV lithography generally have a structure in which a multilayer reflective film to reflect EUV light and an absorber film to absorb EUV light are sequentially disposed on a substrate such as glass or silicon, and a protective film is disposed between the absorber film and the multilayer reflective film in order to protect the multilayer reflective film during the formation of a transfer pattern in the absorber film.

As mentioned above, a prescribed transfer pattern is formed in the absorber film. In an exposure machine carrying out pattern transferring, the light incident on the reflective mask is partly absorbed by the absorber film pattern and is partly reflected by the multilayer reflective film exposed from the absorber film pattern. The reflected light image is transferred onto a workpiece such as a silicon wafer through a reflective optical system.

In an exemplary method for the formation of a transfer pattern in the absorber film, a resist pattern is formed on the absorber film of the EUV reflective mask blank in which the multilayer reflective film, the protective film and the absorber film are formed in this order on the substrate; the absorber film is then etched by dry etching or the like while using the resist pattern as a mask; and the resist pattern is removed. (When, for example, the absorber film is a Ta-containing material, the absorber film pattern is formed by dry etching with a Cl-based gas.)

In the above method, over-etching is carried out to some degree to ensure that the absorber film will be completely patterned. As a result, the film disposed under the absorber film will be etched as well. Thus, a protective film is generally provided on the multilayer reflective film to prevent the surface of the multilayer reflective film from being damaged by etching. Protective films including ruthenium have been proposed for this protective purpose (Patent Literature 1). Further, protective films including a Ru alloy of ruthenium with zirconium and boron have been proposed (Patent Literature 2) in order to suppress the formation of a diffusion layer between a Si layer defining the surface of a multilayer reflective film and the protective film (the formation of such a diffusion layer leads to a decrease in the reflectance of the multilayer reflective film).

CITATION LIST

Patent Literature

Patent Literature 1: Japanese Patent Application Kokai Publication No. 2002-122981
Patent Literature 2: Japanese Patent Application Kokai Publication No. 2008-016821

DISCLOSURE OF INVENTION

Technical Problem

The steps for manufacturing EUV reflective masks generally involve wet cleaning with acidic or alkaline aqueous (chemical) solutions for purposes such as removing the resists after forming absorber film patterns. Further, wet cleaning with chemical solutions is also performed in the manufacturing of semiconductor devices to remove foreign substances that have become attached to the reflective masks during exposure. This cleaning is repeated plural times in accordance with the degree of contamination of the reflective masks with contaminants such as foreign substances until a certain level of cleanliness is obtained.

The Ru protective films and Ru alloy protective films of the Ru-(Zr, B) described in Patent Literatures 1 and 2 suffer a significant thickness decrease after mask cleaning, and in some cases there arises a problem that the entirety of the protective film becomes extinct.

The present inventors have studied this thickness decrease or extinction of the protective films. They have confirmed with SEM images that Ru chloride or Ru-(Zr, B) chloride is formed by the Cl-based gas used for the formation of absorber film pattern, and the subsequent chemical cleaning causes the thickness decrease or extinction of the Ru protective films or the Ru-(Zr, B) protective films together with the Ru chloride or the Ru-(Zr, B) chloride.

It is therefore an object of the present invention to provide a substrate with a multilayer reflective film used in the manufacturing of a reflective mask blank for EUV lithography which is to be subjected to dry etching with a Cl-based gas, wherein in the substrate with the multilayer reflective film, the loss of protective film by the dry etching and subsequent wet cleaning is very limited.

It is another object of the present invention to provide a reflective mask blank for EUV lithography manufactured utilizing the substrate with the multilayer reflective film, a method of manufacturing a reflective mask for EUV lithography utilizing the mask blank, and a method of manufacturing a semiconductor device utilizing a mask obtained by the manufacturing method.

Solution to Problem

The present inventors carried out studies to achieve the above objects. As a result, they have found that the use of alloys which are all-proportional solid solutions as protective film materials results in protective films which suffer a very limited loss even when subjected to dry etching with a Cl-based gas and subsequent wet cleaning. The present invention has been completed based on the finding.

The present invention provides a substrate with a multilayer reflective film used in the manufacturing of a reflective mask blank for EUV lithography, comprising:

a substrate, a multilayer reflective film disposed on the substrate to reflect EUV light, and a protective film disposed on the multilayer reflective film to protect the multilayer reflective film, the protective film includes an alloy containing at least two metals, the alloy being an all-proportional solid solution.

The alloy is preferably an alloy including ruthenium (Ru) and cobalt (Co), an alloy including ruthenium (Ru) and rhenium (Re), an alloy including nickel (Ni) and copper (Cu), an alloy including gold (Au) and silver (Ag), an alloy including silver (Ag) and tin (Sn), an alloy including silver (Ag) and copper (Cu) or an alloy including germanium (Ge) and silicon (Si), more preferably an alloy including ruthenium (Ru) and cobalt (Co), an alloy including ruthenium (Ru) and rhenium (Re), an alloy including nickel (Ni) and copper (Cu) or an alloy including germanium (Ge) and silicon (Si), and particularly preferably an alloy including ruthenium (Ru) and cobalt (Co) or an alloy including ruthenium (Ru) and rhenium (Re).

In the alloy including ruthenium (Ru) and cobalt (Co) and the alloy including ruthenium (Ru) and rhenium (Re), the ruthenium (Ru) content in the alloy is preferably not less than 75 at % and not more than 99.5 at %.

The present invention provides a reflective mask blank for EUV lithography, comprising the substrate with the multilayer reflective film and an absorber film disposed on the protective film of the substrate to absorb EUV light.

The absorber film usually includes a material etchable by dry etching with a chlorine (Cl)-based gas, and preferably includes a tantalum compound containing tantalum (Ta).

The present invention provides a method of manufacturing a reflective mask for EUV lithography, comprising a step of forming an absorber film pattern on the protective film by dry etching the absorber film of the reflective mask blank for EUV lithography with a chlorine (Cl)-based gas.

Further, the present invention provides a method of manufacturing a semiconductor device, comprising a step of forming a transferred pattern on a workpiece with use of a reflective mask for EUV lithography obtained by the method of manufacturing a reflective mask for EUV lithography.

Advantageous Effects of Invention

According to the present invention, there is provided the substrate with the multilayer reflective film used in the manufacturing of a reflective mask blank for EUV lithography which is to be subjected to dry etching with a Cl-based gas, wherein in the substrate with the multilayer reflective film, the loss of the protective film by the dry etching and subsequent wet cleaning is very limited. And there are further provided the reflective mask blank for EUV lithography manufactured utilizing the substrate with the multilayer reflective film, the method of manufacturing a reflective mask for EUV lithography utilizing the mask blank, and the method of manufacturing a semiconductor device utilizing the mask obtained by the manufacturing method.

DESCRIPTION OF EMBODIMENTS

Hereinbelow, the present invention will be described in detail.

[Substrate with a Multilayer Reflective Film]
⟨Substrate⟩

Figure 1:
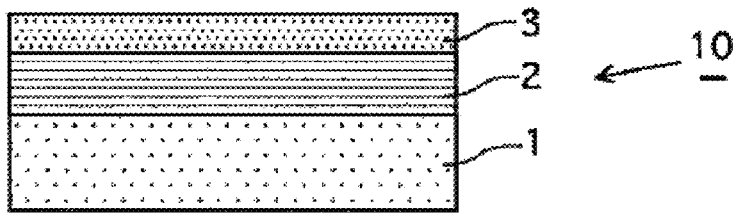
FIG. 1 is a schematic view illustrating a substrate with a multilayer reflective film of the present invention.

FIG. 1 is a schematic view illustrating a substrate with a multilayer reflective film of the present invention. To prevent the distortion of an absorber film pattern by heat applied during exposure, a substrate 1 used in the substrate with the multilayer reflective film 10 of the present invention preferably has a low thermal expansion coefficient (in the range of $0\pm1.0\times10^{-7}$/° C., and more preferably $0\pm0.3\times10^{-7}$/° C.) and excellent smoothness, flatness and resistance to acidic and alkaline aqueous solutions. Examples of such substrates 1 include low thermal expansion glasses such as $TiO_2$—$SiO_2$ glass, as well as β quartz solid solution-precipitated crystalline glass, quartz glass, silicon and metal substrates. Examples of the metal substrates include invar alloys (Fe—Ni alloys).

The substrate 1 preferably has a smooth surface of not more than 0.2 nm Rms and a degree of flatness of not more than 100 nm, in which case the substrate with the multilayer reflective film 10 advantageously gives a reflective mask for EUV lithography having high reflectance and high transfer accuracy. In order for the substrate 1 to be prevented from being deformed by stress of films disposed thereon (such as a multilayer reflective film 2), it preferably has high rigidity. In particular, the substrate 1 preferably has a high Young's modulus of not less than 65 GPa.

In the present specification, the parameter Rms that is an indicator of smoothness is a root mean squared roughness and may be measured with an atomic force microscope. Further, the degree of flatness in the present specification is a value that indicates the warpage (the amount of deformation) of the surface expressed by total indicated reading (TIR). Specifically, a plane that serves as a focal plane is determined by a least square method with reference to the surface of the substrate, and the difference in height between the farthest locations of the substrate surface above and below the focal plane is obtained in an absolute value. In the present invention, the degree of flatness is measured over an area of 142 mm×142 mm.

⟨Multilayer Reflective Films⟩

In the substrate with the multilayer reflective film 10 of the present invention, a multilayer reflective film 2 is disposed on the substrate 1 described above. This film 2 imparts a function to reflect EUV light to a reflective mask for EUV lithography, and has a form of a multilayer film in which elements having different refractive indexes are laminated periodically on top of one another.

The materials for the multilayer reflective films 2 are not particularly limited as long as they reflect EUV light. However, the reflectance of the multilayer reflective film itself is usually not less than 65%, and the upper limit thereof is usually 73%. Such a multilayer reflective film 2 is generally a multilayer film in which thin films of a heavy element or a compound thereof and thin films of a light element or a compound thereof are alternately laminated with approximately 40 to 60 cycles.

For example, a preferred multilayer reflective film 2 designed to reflect 13-14 nm wavelength EUV light is a periodic Mo/Si laminated film in which Mo films and Si films are alternately laminated with approximately 40 cycles. Other examples of the multilayer reflective films which may be used in the EUV light region include periodic Ru/Si multilayer films, periodic Mo/Be multilayer films, periodic Mo compound/Si compound multilayer films, periodic Si/Nb multilayer films, periodic Si/Mo/Ru multilayer films, periodic Si/Mo/Ru/Mo multilayer films, and periodic Si/Ru/Mo/Ru multilayer films.

The materials of the multilayer reflective film 2 and the thicknesses of respective constituent films may be selected appropriately in accordance with exposure wavelength. The thicknesses are selected to meet the Bragg's law. In the multilayer reflective film 2, the film adjacent to the substrate 1 and the film adjacent to a protective film 3 disposed on the multilayer reflective film 2 may be selected appropriately in consideration of, for example, the reflectance characteristics of the films in the exposure wavelength.

The multilayer reflective film 2 may be formed by a method known in the art. For example, it may be produced by forming the respective layers by a magnetron sputtering method or an ion beam sputtering method. In the case of a periodic Mo/Si multilayer film, for example, by ion beam sputtering method, a Si film is formed first with a thickness of about several nm on the substrate 1 using a Si target, thereafter a Mo film is formed with a thickness of about several nm using a Mo target, and this cycle is repeated 40 to 60 times to form a multilayer reflective film 2.

⟨Protective Film⟩

On the multilayer reflective film 2 formed as described above, a protective film 3 is provided which protects the multilayer reflective film 2 from dry etching and wet cleaning during the steps for the manufacturing of a reflective mask for EUV lithography, thus completing the substrate with the multilayer reflective film 10.

As mentioned in "Technical Problem", the steps in which EUV reflective masks are produced or used usually involve dry etching with a Cl-based gas and multiple wet cleanings. Although Ru protective films and Ru alloy protective films of Ru-(Zr, B) have been proposed as protective films for the protection of multilayer reflective films from dry etching, these protective films suffer a significant thickness decrease after mask cleaning. In some cases, the entirety of such a protective film 3 becomes extinct and consequently a multilayer reflective film 2 is damaged. This deteriorates the reflectance and the flatness of the multilayer reflective film 2, and the resultant reflective mask fails to attain superior quality. Even when the initial quality is satisfactory, it is very difficult to maintain the quality because the reflective mask undergoes wet cleaning during its use as well.

As mentioned above, the present inventors have studied this thickness decrease or extinction of the protective films, and have revealed that chlorides are formed by the Cl-based gas used for the formation of absorber film pattern, and the subsequent chemical cleaning causes the thickness decrease or extinction of the Ru protective films or the Ru-(Zr, B) protective films together with the chlorides.

The present inventors then studied approaches that would prevent the formation of such chlorides in protective films by dry etching. As a result, it has been found that the use of a protective film 3 including an alloy containing at least two metals that is an all-proportional solid solution prevents highly effectively the loss of protective film 3 and thus can prevent damages to the multilayer reflective film 2.

The all-proportional solid solution refers to an alloy in which the respective constituent metals form a solution at any concentrations in both liquid phase and solid phase. Alloys that are all-proportional solid solutions are very stable and are unlikely to be chlorinated by dry etching with a Cl-based gas.

Examples of the alloys that are all-proportional solid solutions include an alloy including ruthenium (Ru) and cobalt (Co), an alloy including ruthenium (Ru) and rhenium (Re), an alloy including nickel (Ni) and copper (Cu), an alloy including gold (Au) and silver (Ag), an alloy including silver (Ag) and tin (Sn), an alloy including silver (Ag) and copper (Cu), and an alloy including germanium (Ge) and silicon (Si).

The protective film 3 may be formed of a single such alloy. Alternatively, the protective film 3 may be formed of a combination of two or more kinds of such alloys.

The alloy that is an all-proportional solid solution constituting the protective film 3 may contain other elements such as oxygen, nitrogen, hydrogen and carbon as long as the protective film 3 remains unlikely to be chlorinated by dry etching with a Cl-based gas and the protective film 3 is restrained from decreasing its thickness or becoming extinct upon wet cleaning.

Further, oxide, nitride, hydride, carbide, oxynitride, oxycarbide, oxycarbonitride or the like of the alloy that is an all-proportional solid solution may be formed on the outermost surface of the protective film 3 as long as the protective film 3 remains unlikely to be chlorinated by dry etching with a Cl-based gas and it is restrained from decreasing its thickness or becoming extinct upon wet cleaning.

Because the protective film 3 remains as a constituent layer in a reflective mask for EUV lithography, its EUV light absorption is preferably low (such that the reflectance of the multilayer reflective film 2 in the presence of the protective film 3 is usually 63% or more (and usually less than 73%)). From this viewpoint, the protective film is more preferably an alloy including ruthenium (Ru) and cobalt (Co), an alloy including ruthenium (Ru) and rhenium (Re), an alloy including nickel (Ni) and copper (Cu) or an alloy including germanium (Ge) and silicon (Si), and is particularly preferably an alloy including ruthenium (Ru) and cobalt (Co) or an alloy including ruthenium (Ru) and rhenium (Re).

In order to ensure that a reflective mask for EUV lithography obtained from the inventive substrate with the multilayer reflective film exhibits high EUV light reflectance (63% or higher reflectance), the Ru content in the alloy including ruthenium (Ru) and cobalt (Co) or the alloy including ruthenium (Ru) and rhenium (Re) is preferably not less than 75 at % and not more than 99.5 at %, more preferably not less than 90 at % and not more than 99.5 at %, and particularly preferably not less than 95 at % and not more than 99.5 at %. The atomic composition may be measured by Auger electron spectroscopy.

The protective film 3 in the present invention includes an alloy containing at least two metals that is an all-proportional solid solution. The protective film 3 of such an alloy may be formed by any of the conventional manufacturing methods for protective films without limitation. Examples of such methods include a magnetron sputtering method and an ion beam sputtering method.

The contents of the respective constituent metals in the alloy may be controlled to the desired values by, for example, changing the types or compositions of the sputtering targets used in the sputtering method.

The thickness of the protective film 3 is not particularly limited, but is determined appropriately such that the protective film will not exert a large influence on the reflectance of the multilayer reflective film 2 and will be able to protect the multilayer reflective film 2 from dry etching and subsequent wet cleaning. For example, the thickness is in the range of 1 to 5 nm. The thickness of the protective film 3 may be adjusted by controlling, for example, the sputtering amounts in the sputtering method.

In the inventive substrate with the multilayer reflective film 10, a backside conductive film may be disposed on the principal surface of the substrate 1 opposite to the side with the multilayer reflective film 2. The backside conductive film serves a purpose of allowing the substrate with the multilayer reflective film or the mask blank to be adsorbed to an electrostatic chuck used as a supporting means for the substrate with the multilayer reflective film 10 during mask blank manufacturing or to an electrostatic chuck used as a supporting means for mask-handling during pattern processing or exposure of the inventive reflective mask blank for EUV lithography described later. Further, the backside conductive film also corrects the stress of the multilayer reflective film 2.

In the inventive substrate with the multilayer reflective film 10, a base film may be provided between the substrate 1 and the multilayer reflective film 2. The base film may be formed to improve the surface smoothness of the substrate 1, to reduce defects, to enhance the optical reflectance of the multilayer reflective film 2, and to correct the stress of the multilayer reflective film 2.

In an embodiment of the substrate with the multilayer reflective film 10 of the present invention, the substrate includes a resist film on the multilayer reflective film 2 or the protective film 3. In such embodiment, a reference mark is formed by photolithography on the multilayer reflective film 2 or the protective film 3, to serve as a reference indicating a position where a defect is present in the substrate 1 or the substrate with the multilayer reflective film 10.

[Reflective Mask Blank for EUV Lithography]

Figure 2:
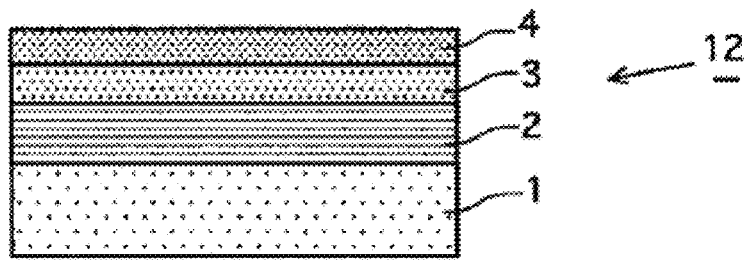
FIG. 2 is a schematic view illustrating a reflective mask blank for EUV lithography of the present invention.

FIG. 2 is a schematic view illustrating a reflective mask blank for EUV lithography 12 of the present invention. The mask blank 12 of the present invention may be obtained by forming an absorber film 4 that absorbs EUV light on the protective film 3 of the aforementioned substrate with the multilayer reflective film 10 of the present invention.

By dry etching it a prescribed absorber film pattern is obtained to give a reflective mask for EUV lithography which has portions that reflect light (EUV light in the present invention) (exposed portions of the protective film 3 and the multilayer reflective film 2 therebelow) and portions that absorb light (the absorber film pattern).

In the substrate with the multilayer reflective film 10, as mentioned above, a backside conductive film for the purpose of an electrostatic chuck may be disposed on the surface of the substrate 1 that is opposite to the surface adjacent to the multilayer reflective film 2. The electrical characteristic required for the backside conductive film is usually not more than 100Ω/☐. The backside conductive film may be formed by a known method. For example, it may be formed by a magnetron sputtering method or an ion beam sputtering method with a metal or alloy target such as chromium (Cr) and tantalum (Ta). The thickness of the backside conductive film is not particularly limited as long as the aforementioned purposes are achieved, but is usually 10 to 200 nm.

The materials constituting the absorber films 4 are not particularly limited as long as the materials have an EUV light absorbing function and can be removed by a treatment such as etching (preferably etchable by dry etching with a chlorine (Cl)-based gas). Preferred materials having such functions are elementary tantalum (Ta) and tantalum compounds containing Ta as a main component.

The tantalum compounds are usually Ta alloys. In terms of smoothness and flatness, such an absorber film 4 preferably has an amorphous or microcrystalline structure. If the surface of the absorber film 4 is poor in smoothness and flatness, patterning of the absorber film may result in an increased edge roughness and a poor accuracy of pattern dimension. The surface roughness of the absorber film 4 is preferably not more than 0.5 nm Rms, more preferably not more than 0.4 nm Rms, and still more preferably not more than 0.3 nm Rms.

Examples of the tantalum compounds include compounds containing Ta and B, compounds containing Ta and N, compounds containing Ta and B as well as at least one of O and N, compounds containing Ta and Si, compounds containing Ta, Si and N, compounds containing Ta and Ge, and compounds containing Ta, Ge and N.

Tantalum has a high EUV light absorption coefficient and is a material easily dry etched with a Cl-based gas. Thus, tantalum is an absorber film material with excellent light-absorbing properties and processability. Further, amorphous materials may be obtained easily by the addition of elements such as boron, silicon and germanium to tantalum, thereby enhancing the smoothness of the absorber film 4. Furthermore, the addition of nitrogen and oxygen to tantalum increases the oxidation resistance of the absorber film 4 and consequently improves over-time stability.

On the other hand, the absorber film material may be microcrystallized by adjusting the heating temperature for the substrate during the formation of the absorber film 4 or by adjusting the pressure of the sputtering gas during film production.

The absorber film 4 described above preferably has an absorption coefficient with respect to the wavelength of exposure light of not less than 0.025, and more preferably not less than 0.030 (and usually not more than 0.080), from the point of allowing the thickness of the absorber film 4 to be reduced.

The thickness of the absorber film 4 is not particularly limited as long as the film can sufficiently absorb EUV light that is the exposure light. The thickness is, however, usually about 30 to 100 nm.

The absorber film 4 may be formed by a known method, for example, a sputtering method such as magnetron sputtering. For example, the absorber film 4 may be formed on the protective film 3 by a sputtering method using a sputtering target containing tantalum and boron and argon gas containing oxygen or nitrogen.

[Method of Manufacturing Reflective Mask for EUV Lithography]

A reflective mask for EUV lithography may be manufactured using the reflective mask blank for EUV lithography of the present invention described above. A manufacturing method is schematically illustrated in FIG. 3.

Figure 3:
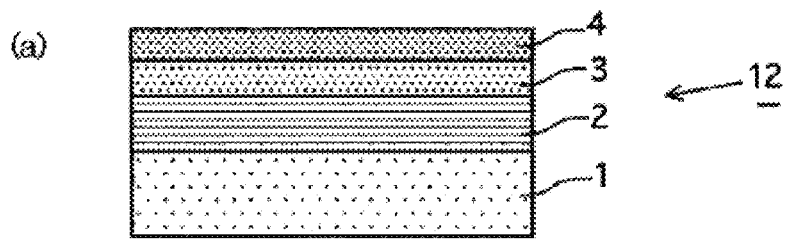
FIG. 3 is a set of schematic views illustrating a method of manufacturing a reflective mask for EUV lithography of the present invention.
Figure 3:
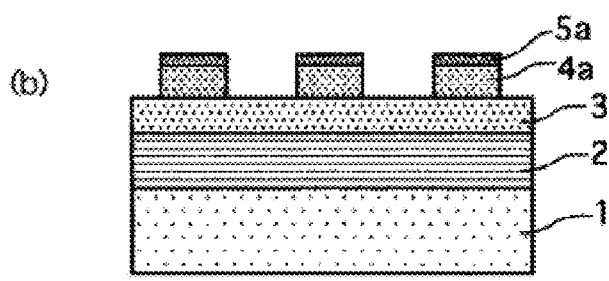
Figure 3:
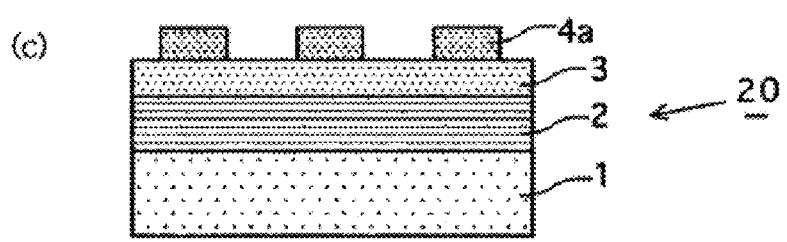

First, a resist film is formed on the absorber film 4 of the mask blank 12 (FIG. 3(*a*)), and a desired pattern is drawn (by exposure) on the resist film, which is then subjected to development and rinsing to form a prescribed resist pattern 5*a*.

While using this resist pattern 5*a* as a mask, dry etching with a Cl-based gas is performed to etch away portions of the absorber film 4 not covered by the resist pattern 5*a*, resulting in formation of an absorber film pattern 4*a* on the protective film 3 (FIG. 3(*b*)).

Because this etching is usually over-etching to ensure the complete formation of the absorber film pattern 4*a*, the protective film 3 too is subjected to dry etching. According to the present invention, the protective film 3 is made of the specific alloy that is an all-proportional solid solution and consequently is highly stable to the etching gas. Thus, it is rare that the protective film will largely decrease its thickness or become extinct during subsequent wet cleanings (including wet cleaning during the use of the reflective mask). That is, the loss of the film is very limited. Accordingly, the multilayer reflective film 2 under the protective film 3 is prevented from damages, and attains and maintains excellent reflectance.

Examples of the Cl-based gases include gas of single chlorine, mixed gases containing chlorine and oxygen in a prescribed ratio, mixed gases containing chlorine and helium in a prescribed ratio, mixed gases containing chlorine and argon in a prescribed ratio, and mixed gases containing chlorine and boron trichloride in a prescribed ratio.

After the resist pattern 5*a* is removed with, for example, a resist removing solution, wet cleaning is performed with acidic or alkaline aqueous solutions. Thus, a reflective mask for EUV lithography 20 may be obtained which achieves high reflectance due to the multilayer reflective film 2 staying intact during the dry etching and the cleaning (FIG. 3(*c*)).

The reflective mask for EUV lithography 20 obtained above is usually subjected to inspection and correction of the pattern. After the pattern is inspected and corrected, the wet cleaning described above is usually performed again. The wet cleaning methods may be selected appropriately in accordance with the targets to be removed. Examples of the wet cleaning include acid alkali cleaning with sulfuric acid/peroxide mixture (SPM) and ammonia/peroxide mixture (APM), functional water cleaning with functional waters such as ozone water and ammoniated hydrogen solution, scrub cleaning, and megasonic cleaning with MHz ultrasonic waves.

[Method of Manufacturing Semiconductor Device]

By a lithographic process using the reflective mask described above, a transferred pattern based on the absorber film pattern of the mask may be formed on a workpiece such as a semiconductor substrate. The semiconductor substrate is then subjected to various steps, thus manufacturing a semiconductor device in which various types of patterns and the like are formed on the semiconductor substrate.

Figure 4:
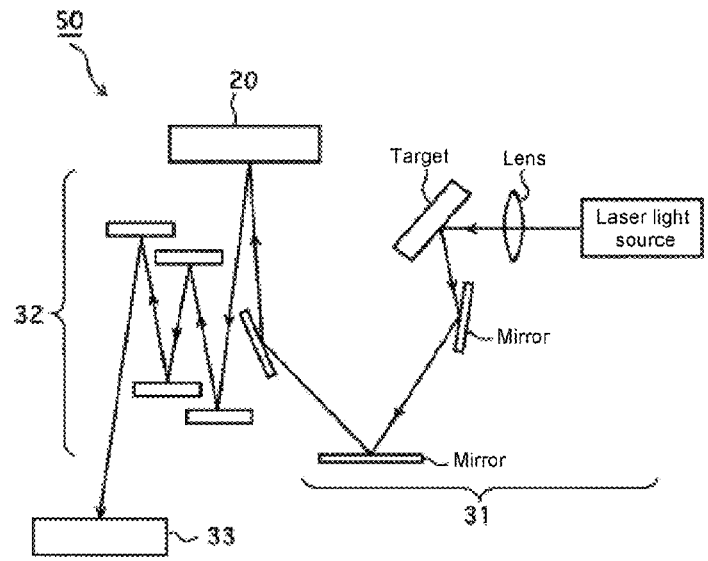
FIG. 4 is a schematic view illustrating a step for transferring a pattern onto a resist-coated semiconductor substrate with a pattern transfer machine.

A more specific example will be described in which a pattern is transferred to a resist-coated semiconductor substrate 33 by applying EUV light with a pattern transfer machine 50 illustrated in FIG. 4 using the reflective mask for EUV lithography 20.

The pattern transfer machine 50 having the reflective mask 20 is generally composed of a laser plasma X-ray source 31, the reflective mask 20, a demagnification optical system 32 and the like. The demagnification optical system 32 includes X-ray reflective mirrors.

The demagnification optical system 32 is usually configured to demagnify a pattern reflected by the reflective mask 20 to a size about ¼ the original. For example, the wavelength range of 13 to 14 nm is used as the exposure wavelength, and the optical path is evacuated to vacuum beforehand. After this setting, the EUV light emitted from the laser plasma X-ray source 31 is caused to be incident on the reflective mask 20 and the light reflected thereby is transferred onto the resist-coated semiconductor substrate 33 through the demagnification optical system 32.

The light incident on the reflective mask 20 is partly absorbed by the absorber film pattern 4*a* and is partly reflected by the multilayer reflective film 2 not covered by the absorber film pattern 4*a*. As a result, the light reflected by the reflective mask 20 forms an image, which is introduced into the demagnification optical system 32. The exposure light passed through the demagnification optical system 32 transfers a pattern into the resist layer of the resist-coated semiconductor substrate 33. This exposed resist layer is then developed to form a resist pattern on the resist-coated semiconductor substrate 33.

Thereafter, by performing etching while using the resist pattern as a mask, a prescribed wiring pattern may be formed on the semiconductor substrate.

Through the above and other necessary steps, a semiconductor device may be manufactured.

EXAMPLES

[Evaluation of Cleaning Resistance of Protective Films]

Comparative Example Sample 1

Both principal surfaces of a 152 mm×152 mm sized $TiO_2$—$SiO_2$ glass (low-thermal expansion glass) substrate were precision polished and cleaned with a polishing liquid which contained colloidal silica abrasive grains. Thus, a substrate with a degree of flatness of 0.05 μm and a surface roughness Rms (a root mean squared roughness) of 0.12 nm was obtained. A Ru protective film was formed on the principal surface of the substrate by a magnetron sputtering method.

Protective film formation conditions: Ru target, sputtering under Ar gas atmosphere, 14 nm film thickness.

Example Sample 1

A RuCo (Ru: 97 at %, Co: 3 at %) protective film was formed on the principal surface of the substrate in the same manner as for Comparative Example Sample 1. The protective film formation conditions were the same as those for Comparative Example Sample 1, except that a Ru97Co3 target (the numbers indicate at %) was used. The compositions of the elements constituting the protective film are values measured by Auger electron spectroscopy. The same applies to Example Samples 2 to 5 and Comparative Example Sample 2 below.

Example Sample 2

A RuCo (Ru: 90 at %, Co: 10 at %) protective film was formed on the principal surface of the substrate in the same manner as for Comparative Example Sample 1. The protective film formation conditions were the same as those for Comparative Example Sample 1, except that a Ru90Co10 target (the numbers indicate at %) was used.

Example Sample 3

A RuCo (Ru: 75 at %, Co: 25 at %) protective film was formed on the principal surface of the substrate in the same manner as for Comparative Example Sample 1. The protective film formation conditions were the same as those for Comparative Example Sample 1, except that a Ru75Co25 target (the numbers indicate at %) was used.

Example Sample 4

A RuCo (Ru: 50 at %, Co: 50 at %) protective film was formed on the principal surface of the substrate in the same manner as for Comparative Example Sample 1. The protective film formation conditions were the same as those for Comparative Example Sample 1, except that a Ru50Co50 target (the numbers indicate at %) was used.

Example Sample 5

A RuRe (Ru: 97 at %, Re: 3 at %) protective film was formed on the principal surface of the substrate in the same manner as for Comparative Example Sample 1. The protective film formation conditions were the same as those for Comparative Example Sample 1, except that a Ru97Re3 target (the numbers indicate at %) was used.

Comparative Example Sample 2

A RuZr (Ru: 80 at %, Zr: 20 at %) protective film (the RuZr is not an all-proportional solid solution) was formed on the principal surface of the substrate in the same manner as for Comparative Example Sample 1. The protective film formation conditions were the same as those for Comparative Example Sample 1, except that a Ru80Zr20 target (the numbers indicate at %) was used.

⟨Evaluation Method⟩

The entire surface of the protective films in Comparative Example Samples 1 and 2 and Example Samples 1 to 5 was subjected to sputter etching with $Cl_2$ gas. The entire-surface sputter etching conditions were, gas pressure: 4 mTorr and treatment time: 15 seconds.

Thereafter, each sample was analyzed by XRR (X-ray reflectometry) as to the thickness of the protective film, and subsequently the etched surface was subjected to wet cleaning with a sulfuric acid/peroxide mixture and an ammonia/peroxide mixture.

The SPM cleaning conditions were, using a sulfuric acid/peroxide mixture containing sulfuric acid (98 mass %) and hydrogen peroxide (30 mass %) in a ratio of 4:1, temperature: 90° C., time: 20 minutes. The APM cleaning conditions were, using an ammonia/peroxide mixture containing ammonia (29 mass %), hydrogen peroxide (30 mass %) and water in a ratio of 1:1:5, temperature: 70° C., time: 20 minutes.

Next, the thickness of the protective film after the wet cleaning was measured by XRR, and a change in film thickness by the wet cleaning was determined. In this manner, the cleaning resistance of the protective film of each sample was evaluated.

⟨Evaluation Results⟩

An increase in thickness of the protective film was observed in Comparative Samples 1 and 2, the increase being ascribed to the formation of chloride generated layer by the entire-surface sputter etching with chlorine gas. By the wet cleaning, the entirety of the Ru protective film in Comparative Example Sample 1 became extinct (film thickness change: −14 nm). The change in film thickness in Comparative Example Sample 2 was −6.0 nm.

Figure 5:
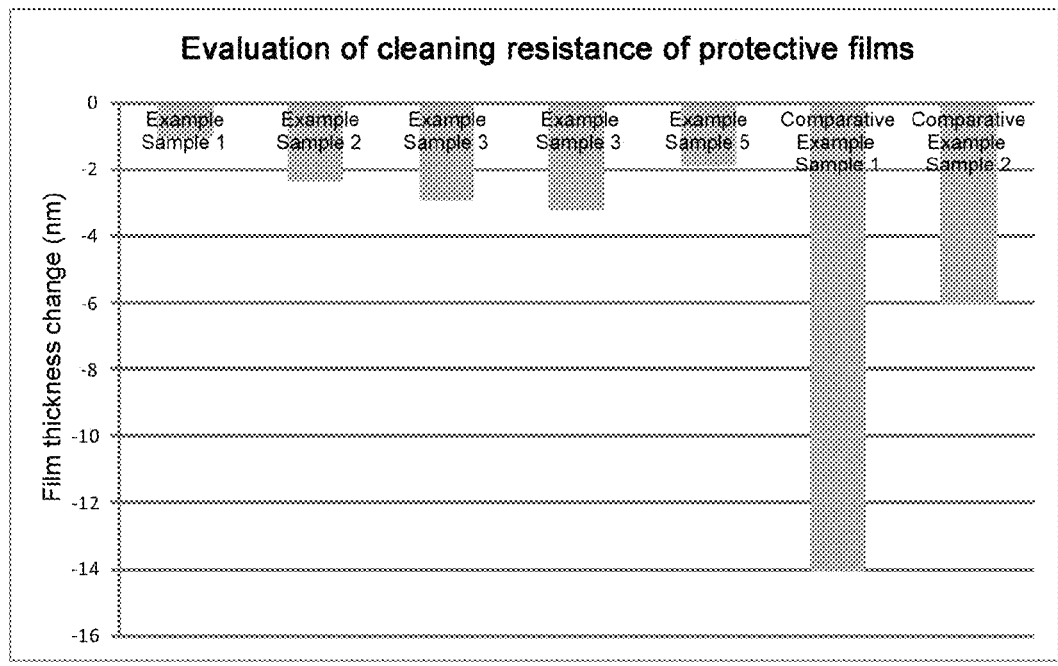
FIG. 5 is a graph showing the results of an evaluation of cleaning resistance of protective films in EXAMPLES. In the graph, the seven bars from the left represent the results for Example Sample 1, Example Sample 2, Example Sample 3, Example Sample 4, Example Sample 5, Comparative Example Sample 1 and Comparative Example Sample 2, respectively.

For Example Samples 1 to 5 that contained RuCo and RuRe alloys that are all-proportional solid solutions, the changes in film thickness by the wet cleaning of Example Samples 1 to 5 were: Example Sample 1 (−1.0 nm), Example Sample 2 (−2.3 nm), Example Sample 3 (−2.9 nm), Example Sample 4 (−3.2 nm) and Example Sample 5 (−1.8 nm). The results are described in FIG. 5 together. As shown, Example Samples 1 to 5 that involved RuCo and RuRe alloys that are all-proportional solid solutions performed well and the changes in film thickness were suppressed to approximately 3 nm or below.

Example 1

Fabrication of Substrate with a Multilayer Reflective Film

Both principal surfaces of a 152 mm×152 mm sized $TiO_2$—$SiO_2$ glass (low-thermal expansion glass) substrate were precision polished and cleaned with a polishing liquid which contained colloidal silica abrasive grains. Thus, a substrate with a degree of flatness of 0.05 μm and a surface roughness Rms (a root mean squared roughness) of 0.12 nm was obtained. A multilayer reflective film was formed on the principal surface of the substrate by an ion beam sputtering method (Mo target and Si target).

The multilayer reflective film: forty periodic cycles of Si (4.2 nm)/Mo (2.8 nm), the (Si) film being adjacent to the principal surface of the substrate, total film thickness: 280 nm.

On the obtained multilayer reflective film, a RuCo protective film (Ru: 97 at %, Co: 3 at %) of Example Sample 1 was formed by a magnetron sputtering method. Thus, a substrate with a multilayer reflective film was obtained. The thickness of the protective film was 2.5 nm.

The substrate with the multilayer reflective film was tested on an EUV reflectance meter to determine the reflectance with respect to EUV light (13.5 nm wavelength). The reflectance was as high as 66%.

Example 2

A substrate with a multilayer reflective film was obtained in the same manner as in Example 1, except that the protective film was RuCo (Ru: 90 at %, Co: 10 at %) with a film thickness of 2.5 nm. Its reflectance with respect to EUV light was 65%.

Example 3

A substrate with a multilayer reflective film was obtained in the same manner as in Example 1, except that the protective film was RuCo (Ru: 75 at %, Co: 25 at %) with a film thickness of 2.5 nm. Its reflectance with respect to EUV light was 64%.

Example 4

A substrate with a multilayer reflective film was obtained in the same manner as in Example 1, except that the protective film was RuRe (Ru: 97 at %, Re: 3 at %) with a film thickness of 2.5 nm. Its reflectance with respect to EUV light was 65%.

Example 5

Fabrication of Reflective Mask Blanks

Regarding each of the substrates with the multilayer reflective film fabricated in Examples 1 to 4, a backside conductive film was formed by a magnetron sputtering method on the principal surface of the substrate opposite to the sides adjacent to the multilayer reflective film.

Conditions in the formation of backside conductive films: Cr target, Ar+N₂ gas atmosphere (Ar:N$_2$=90%:10%), film composition (Cr: 90 at %, N: 10 at %), film thickness: 20 nm.

Subsequently, an absorber film (a TaBN film) was formed on the protective film by a magnetron sputtering method. Thus, reflective mask blanks were obtained.

Conditions in the formation of TaBN films: TaB target (Ta:B=80:20), Xe+N$_2$ atmosphere (Xe:N$_2$=90%:10%), film composition (Ta: 80 at %, B: 10 at %, N: 10 at %), film thickness: 65 nm.

Example 6

Fabrication of Reflective Masks

A resist was applied by a spin coating method over the absorber film of each reflective mask blanks obtained in Example 5. The resist was then heated and cooled to form a resist film (film thickness: 120 nm).

A prescribed pattern was drawn on the resist film and was developed to form a resist pattern. While using this resist pattern as a mask, the absorber film that was a TaBN film was patterned by dry etching with Cl$_2$ gas. After the resist film was removed with a resist removing solution, wet cleaning was performed as described hereinabove. In this manner, reflective masks were fabricated.

All the reflective masks fabricated from the substrates with the multilayer reflective film of Examples 1 to 4 had no loss of the protective film and maintained a high EUV light reflectance of 64% or above. The results of reflectance measurement remained the same even after the wet cleaning was repeated three times.

Accordingly, these reflective masks from Examples 1 to 4 can maintain high contrast between the reflection of EUV light by the surfaces of the respective constituent films of the multilayer reflective film as well as the surface of the protective film and the absorption of EUV light by the absorber film pattern during a lithographic process with a pattern transfer machine, whereby it is possible to, for example, manufacture semiconductor devices having desired circuit patterns.

Comparative Example 1

Reflective masks were fabricated according to the procedures described in Example 6, except that the protective films in Comparative Example Samples 1 and 2 were used. The masks obtained had lost the entirety of the protective film, and the reflectance of the masks with respect to EUV light was decreased to 60% due to damages to the multilayer reflective films.

REFERENCE SIGNS LIST

1 Substrate
2 Multilayer reflective film
3 Protective film
4 Absorber film
4*a* Absorber film pattern
5*a* Resist pattern
10 Substrate with a multilayer reflective film
12 Reflective mask blank for EUV lithography
20 Reflective mask
31 Laser plasma X-ray source
32 Demagnification optical system
33 Resist-coated semiconductor substrate
50 Pattern transfer machine

The invention claimed is:

1. A substrate with a multilayer reflective film used in the manufacturing of a reflective mask blank for EUV lithography, comprising:
a substrate, a multilayer reflective film disposed on the substrate to reflect EUV light, and a protective film disposed on the multilayer reflective film to protect the multilayer reflective film,
wherein the protective film includes an alloy containing at least two metals, the alloy being an all-proportional solid solution.

2. The substrate with the multilayer reflective film according to claim 1, wherein the alloy is an alloy including ruthenium (Ru) and cobalt (Co), an alloy including ruthenium (Ru) and rhenium (Re), an alloy including nickel (Ni) and copper (Cu), an alloy including gold (Au) and silver (Ag), an alloy including silver (Ag) and tin (Sn), an alloy including silver (Ag) and copper (Cu) or an alloy including germanium (Ge) and silicon (Si).

3. The substrate with the multilayer reflective film according to claim 2, wherein in the alloy including ruthenium (Ru) and cobalt (Co) and the alloy including ruthenium (Ru) and rhenium (Re), the ruthenium (Ru) content in the alloy is not less than 75 at % and not more than 99.5 at %.

4. The substrate with the multilayer reflective film according to claim 1, wherein the alloy is an alloy including ruthenium (Ru) and cobalt (Co), an alloy including ruthenium (Ru) and rhenium (Re), an alloy including nickel (Ni) and copper (Cu) or an alloy including germanium (Ge) and silicon (Si).

5. The substrate with the multilayer reflective film according to claim 4, wherein, in the alloy including ruthenium (Ru) and cobalt (Co) and the alloy including ruthenium (Ru) and rhenium (Re), the ruthenium (Ru) content in the alloy is not less than 75 at % and not more than 99.5 at %.

6. The substrate with the multilayer reflective film according claim 1, wherein the alloy is an alloy including ruthenium (Ru) and cobalt (Co) or an alloy including ruthenium (Ru) and rhenium (Re).

7. A reflective mask blank for EUV lithography, comprising the substrate with the multilayer reflective film described in claim 1, and an absorber film disposed on the protective film of the substrate to absorb EUV light.

8. The reflective mask blank for EUV lithography according to claim 7, wherein the absorber film includes a material etchable by dry etching with a chlorine (Cl)-based gas.

9. The reflective mask blank for EUV lithography according to claim 7, wherein the absorber film includes a tantalum compound containing tantalum (Ta).

10. A method of manufacturing a reflective mask for EUV lithography, comprising a step of forming an absorber film pattern on the protective film by dry etching the absorber film of the reflective mask blank for EUV lithography described in claim 7 with a chlorine (Cl)-based gas.

11. A method of manufacturing a semiconductor device, comprising a step of forming a transferred pattern on a workpiece with use of a reflective mask for EUV lithography obtained by the method of manufacturing a reflective mask for EUV lithography described in claim 10.

12. A reflective mask blank for EUV lithography, comprising:
a substrate, a multilayer reflective film disposed on the substrate to reflect EUV light, a protective film disposed on the multilayer reflective film to protect the multilayer reflective film, and an absorber film disposed on the protective film to absorb EUV light, wherein the protective film includes an alloy containing at least two metals, the alloy being an all-proportional solid solution.

13. The reflective mask blank for EUV lithography according to claim 12, wherein the alloy is an alloy including ruthenium (Ru) and cobalt (Co), an alloy including ruthenium (Ru) and rhenium (Re), an alloy including nickel (Ni) and copper (Cu), an alloy including gold (Au) and silver (Ag), an alloy including silver (Ag) and tin (Sn), an alloy including silver (Ag) and copper (Cu) or an alloy including germanium (Ge) and silicon (Si).

14. The reflective mask blank for EUV lithography according to claim 12, wherein the alloy is an alloy including ruthenium (Ru) and cobalt (Co), an alloy including ruthenium (Ru) and rhenium (Re), an alloy including nickel (Ni) and copper (Cu) or an alloy including germanium (Ge) and silicon (Si).

15. The reflective mask blank for EUV lithography according to claim 12, wherein, in the alloy including ruthenium (Ru) and cobalt (Co) and the alloy including ruthenium (Ru) and rhenium (Re), the ruthenium (Ru) content in the alloy is not less than 75 at % and not more than 99.5 at %.

16. The reflective mask blank for EUV lithography according to claim 12, wherein the alloy is an alloy including ruthenium (Ru) and cobalt (Co) or an alloy including ruthenium (Ru) and rhenium (Re).

17. The reflective mask blank for EUV lithography according to claim 12, wherein the absorber film includes a material etchable by dry etching with a chlorine (Cl)-based gas.

18. The reflective mask blank for EUV lithography according to claim 12, wherein the absorber film includes a tantalum compound containing tantalum (Ta).

19. A reflective mask for EUV lithography, comprising:
a substrate, a multilayer reflective film disposed on the substrate to reflect EUV light, a protective film disposed on the multilayer reflective film to protect the multilayer reflective film, and an absorber film pattern disposed on the protective film to absorb EUV light,
wherein the protective film includes an alloy containing at least two metals, the alloy being an all-proportional solid solution.

20. The reflective mask for EUV lithography according to claim 19, wherein the alloy is an alloy including ruthenium (Ru) and cobalt (Co), an alloy including ruthenium (Ru) and rhenium (Re), an alloy including nickel (Ni) and copper (Cu), an alloy including gold (Au) and silver (Ag), an alloy including silver (Ag) and tin (Sn), an alloy including silver (Ag) and copper (Cu) or an alloy including germanium (Ge) and silicon (Si).

21. The reflective mask for EUV lithography according to claim 19, wherein the absorber film pattern includes a material etchable by dry etching with a chlorine (Cl)-based gas.

22. The reflective mask for EUV lithography according to claim 19, wherein the absorber film pattern includes a tantalum compound containing tantalum (Ta).

* * * * *